United States Patent [19]

Jasinski et al.

[11] 4,016,501
[45] Apr. 5, 1977

[54] SWITCHING AMPLIFIER SYSTEM

[75] Inventors: Leon Jasinski, Fort Lauderdale; Francis Robert Steel, Parkland, both of Fla.

[73] Assignee: Motorola, Inc., Schaumburg, Ill.

[22] Filed: Dec. 29, 1975

[21] Appl. No.: 644,484

[52] U.S. Cl. .............................. 330/10; 330/207 A
[51] Int. Cl.² .......................................... H03F 3/38
[58] Field of Search ............... 330/10, 146, 207 A; 329/106

[56] References Cited
UNITED STATES PATENTS

| | | | |
|---|---|---|---|
| 3,253,228 | 5/1966 | Montner | 330/10 |
| 3,585,517 | 6/1971 | Herbert | 330/10 |
| 3,629,616 | 12/1971 | Walker | 330/207 A |
| 3,829,788 | 8/1974 | Ford | 330/10 |

*Primary Examiner*—James B. Mullins
*Attorney, Agent, or Firm*—Margaret Marsh Parker; Donald B. Southard; James W. Gillman

[57] ABSTRACT

A switching amplifier includes a pulse width modulator for converting a bipolar input signal, which may be a speech signal, into a train of unipolar pulses having durations which vary with the instantaneous absolute amplitude of the input signal. The pulses control the energizing of a series switch which supplies current to a switching bridge circuit. The switching arms of the bridge circuit are controlled by the polarity of the input signal. Another switch and several diodes are used to provide a path for output current when the series switch is open. The output current is filtered to remove fluctuations at the switching rate, and applied to a load. The amplified output voltage signal accurately follows the input signal, and the efficiency of conversion of DC power to AC output power can approach 100 percent, limited only by switching and filtering losses. A single polarity DC supply, such as a battery, is used to provide bipolar output current to an ungrounded load. High efficiency is maintained even with partially reactive loads, since the switching circuits return reactive power to the DC power supply.

7 Claims, 2 Drawing Figures

U.S. Patent
April 5, 1977
4,016,501
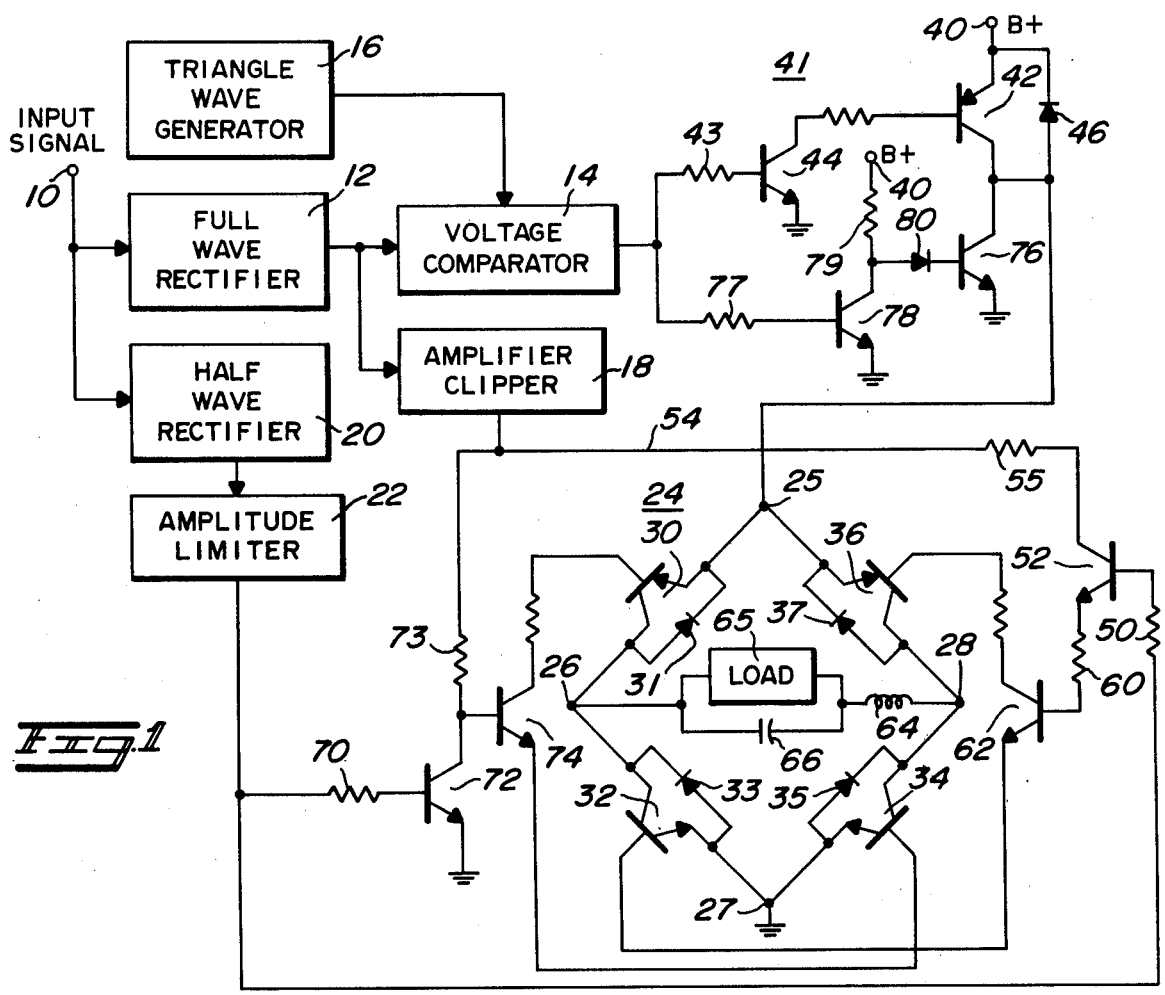
_Fig. 1_
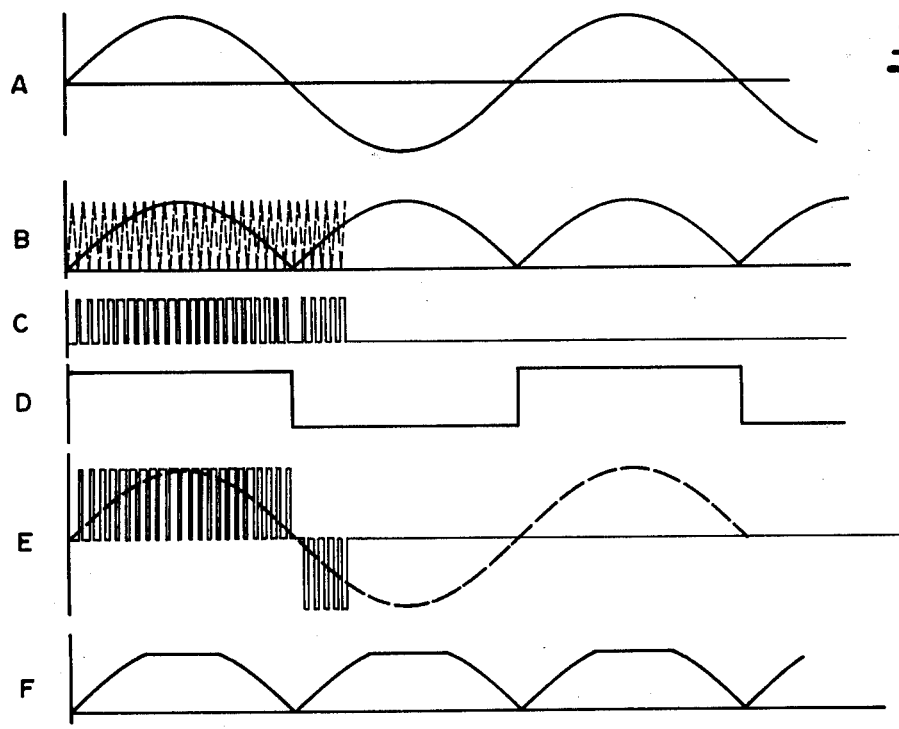
_Fig. 2_

SWITCHING AMPLIFIER SYSTEM

BACKGROUND OF THE INVENTION

Power amplifiers for use with speech input signals have had the disadvantage that the output signal power has been only a small part of the power which is required to operate the amplifier. Switching amplifiers have been used to provide greater efficiency, but these amplifiers have not been suitable for battery operated equipment because they have required dual polarity power supplies. Further, these amplifiers have generally been complex and costly, partly because they required a large number of high speed switching devices. It has not been possible to provide satisfactory high speed switching devices, as required, by known integrated circuit techniques so that the resulting amplifiers have been large and not suitable for use in small portable equipment.

Known switching amplifiers have not been highly efficient when used to amplify speech signals where the average signal level is much below (12 db, for example) the peak level, as substantial power has been required to operate the amplifiers at low signal levels.

SUMMARY OF THE INVENTION

It is an object of this invention to provide a highly efficient switching amplifier which is suitable for use with speech signals, and which provides the desired audio quality for use as an audio power amplifier.

Another object of this invention is to provide a switching amplifier for operation by a single polarity power supply, which switches at the relatively slow signal frequency to provide a bipolar output having a peak-to-peak voltage equal to twice the supply voltage.

A further object of the invention is to provide an amplifier including a bridge circuit having switching arms which are selectively enabled to reverse the current applied to a load in accordance with the polarity of the applied signal, and wherein current pulses are applied to the bridge by a switch controlled by the pulse width modulated input signal.

A still further object of the invention is to provide a switching audio amplifier for driving a reactive load wherein the amplifier circuit includes paths for reverse current flow for efficient coupling to the load.

Still another object of the invention is to provide an efficient switching amplifier wherein the bias voltage applied to the driver transistors is reduced at low signal values to reduce the dissipation in the transistors.

In accordance with the invention, the switching amplifier includes a pulse width modulator for converting the applied wave, which may be an audio signal, into a train of pulses of constant repetition rate and amplitude, but of different durations (duty cycles). The modulator includes a full wave rectifier which supplies the rectified applied signal to a comparator to which a triangular wave is also applied. The triangular wave has a frequency substantially greater than the highest frequency of the sinusoidal wave and a constant amplitude substantially equal to the highest amplitude of the rectified wave. The comparator provides a fixed amplitude output when the rectified wave has an instantaneous amplitude greater than that of the triangular wave. The comparator output controls the energization of a switch which applies current to a bridge circuit having switching arms for supplying current to a load. The switching arms are controlled by a half wave rectifier to which the input signal is applied so that the arms selectively conduct to reverse the current in the load in accordance with the polarity of the input signal. The load is connected to the bridge circuit by a filter which removes fluctuations at the switching rate and applies a voltage to the load which is an accurate amplified representation of the applied wave. The bridge arms and the energizing circuit include paths for reverse current flow so that the amplifier can be used to feed a reactive load, such as a loudspeaker. Bias voltage for the drivers of the switching circuit can be derived from the full wave rectifier through an amplifier and clipper circuit so that this voltage is reduced at low signal values to reduce the dissipation in the driver transistors. This cooperates with the basic efficiency of the switching amplifier circuit to provide a highly efficient power amplifier, which is suitable for use as an audio amplifier.

BRIEF DESCRIPTION OF THE DRAWINGS

FIG. 1 is a schematic diagram, partly in block diagram form, of the switching amplifier system of the invention; and FIG. 2 is a chart with waveforms illustrating the operation of the system of FIG. 1.

DETAILED DESCRIPTION OF THE INVENTION

FIG. 1 illustrates the switching amplifier system of the invention with certain well known elements shown by block diagram and the remainder shown by complete circuit diagram. The input signal, which may be an audio signal such as a voice signal having frequencies up to 3 kHz, is applied at terminal 10. This input wave is applied to two paths, the first including a full wave rectifier 12 which has a very low forward voltage drop. A rectifier of known construction utilizing operational amplifiers with diode feedback elements is suitable for this use. Coupled to the rectifier 12 is a voltage comparator 14 to which a triangular wave is also applied by triangle wave generator 16. The triangle wave generator 16 produces a symmetrical wave having a frequency of the order of 100 kHz with valleys at zero potential and peaks having a constant amplitude substantially equal to the maximum amplitude of the rectified wave applied to comparator 14. The voltage comparator 14 produces a constant amplitude pulse output in response to each portion of the rectified wave having an amplitude which exceeds the amplitude of the triangle wave. Accordingly, a pulse is produced for each cycle of the triangular wave, with the duty cycle of the pulses (pulse durations) varying with the amplitude of the rectified wave. The ouput of the comparator 14 is a pulse train which is a pulse width modulation of the applied wave.

FIG. 2 illustrates the waves utilized in the system of FIG. 1, with line A illustrating the input signal as a sinusoidal wave, which might be a part of an audio signal. Line B of FIG. 2, shows the rectified input signal by solid line, with the triangular wave from generator 16 being shown by a superimposed dotted line. The triangular wave will actually be at a higher frequency than illustrated, but it is believed that the waves shown will indicate the operation of the voltage comparator 14. Line C shows the output of the comparator which is a train of pulses, each being centered about a zero or valley of the triangular wave. Each pulse continues for the time that the rectified wave has an amplitude greater than the amplitude of the triangular wave. The action of the comparator 14 and the triangle wave generator 16 is that of a pulse width modulator, and this action is known in the art.

The second path connected to the input terminal 10 includes half wave rectifier 20 and amplitude limiter 22. The rectifier will pass half cycles of the input wave of one polarity, such as positive half cycles, and the limiter 22 will convert these half cycles to a square wave. The output of limiter 22 is shown by line D in FIG. 2, and it is apparent that this wave has a positive value during positive half cycles of the input wave, and has a zero value during the negative half cycles.

The switching amplifier action of the system of the invention is accomplished by a bridge circuit 24 which has four corner terminals 25, 26, 27 and 28. Connected between each adjacent pair of corner terminals is a switching circuit or arm including a transistor bridged by a diode which conducts in the direction opposite to the direction of conduction of the transistor. Between terminals 25 and 26 is transistor 30 bridged by diode 31, with transistor 32 and diode 33 connected in parallel between terminals 26 and 27, transistor 34 and diode 35 between terminals 27 and 28, and transistor 36 and diode 37 between terminals 28 and 25.

Current is applied to the bridge circuit 24 from the +V terminal 40, which may be the terminal of a battery, through an energizing circuit 41 which includes transistor 42. The emitter to collector path of transistor 42 connects the supply terminal 40 to bridge terminal 25, and the opposite bridge terminal 27 is connected to ground.

Transistor 42 is controlled by the output of voltage comparator 14, which is applied through resistor 43 to transistor 44. The collector electrode of transistor 44 is connected through resistor 45 to the base electrode of transistor 42 to control its conduction. The positive pulses from voltage comparator 14, as shown by line C of FIG. 2, act to turn on transistor 44. This in turn renders transistor 42 conductive to connect the +V operating voltage from terminal 40 to the bridge circuit terminal 25.

Considering now the operation of the bridge circuit 24, the transistors 30, 32, 34 and 36 are selectively enabled in accordance with the wave from limiter 22, which is illustrated by line D of FIG. 2. The positive potential from limiter 22 is applied through resistor 50 to the base electrode of transistor 52 and through resistor 70 to the base electrode of transistor 72 to turn on these transistors. Conductor 54, which is connected through resistor 55 to the collector electrode of transistor 52, and through resistor 73 to the collector electrode of transistor 72, applies a positive potential thereto. This can be a fixed supply potential, but conductor 54 is shown connected to the output of amplifier clipper 18 for a reason which will be explained. The conduction of transistor 52 applies the positive potential from conductor 54 through resistors 55 and 60 to the base electrode of transistor 62 to render this driver transistor conductive. This enables transistors 32 and 36 of the bridge circuit 24 so that they conduct during the positive half cycles of the input signal.

During the positive half cycles when pulses from comparator 14 turn on transistor 42, current is applied from supply terminal 40 through transistors 32 and 36 to provide current flow through the bridge circuit. This path extends through transistors 42 and 36 to the diagonal path of the bridge, which includes coil 64 in series with load 65, and through transistor 32 to terminal 27 which is connected to ground. A capacitor 66 is connected across the load 65, with coil 64 and capacitor 66 forming a filter for smoothing the current applied to the load.

During the negative half cycles of the input signal, the output of limiter 22 is zero. This potential is applied through resistor 70 to the base of transistor 72 to turn off this transistor. When transistor 72 is non-conductive, the potential on conductor 54 is applied through resistor 73 to the base electrode of driver transistor 74 to render the same conductive to enable transistors 30 and 34 of the bridge circuit 24. This causes current flow in the bridge circuit in response to pulses from comparator 14, which flow is through transistors 42 and 30, load 65, coil 64 and transistor 34 to ground. It will be noted that the current flow through the load 65 is in the opposite direction, during the negative half cycles of the input wave, to the direction of current flow therethrough during the positive half cycles. When the signal from the amplitude limiter 22 is zero, as just described, transistor 52 will turn off to render transistor 62 non-conductive, so that transistors 32 and 36 of the bridge circuit are off. Similarly when the signal from limiter 22 is positive, transistor 72 will turn on to render transistor 74 non-conductive, and transistors 30 and 34 of the bridge circuit are held off.

Line E of FIG. 2 illustrates the action of the bridge circuit 24 as just described. During positive half cycles of the input signal (line A) current pulses will flow in one direction through the load which is connected in the diagonal path of the bridge circuit, as shown by the positive pulses in line E. During negative half cycles of the input signal, current pulses will flow through the load in the opposite direction as shown by the negative pulses in line E. The output is filtered by coil 64 and capacitor 66 so that a voltage wave of substantially sinusoidal wave form is applied to the load 65. This voltage wave is of substantially the same wave shape as the input signal, as illustrated by the dotted line in line E of FIG. 2. The values of coil 64 and capacitor 66 can be selected in relation to the impedance of the load, the highest frequency of the signal processed, the frequency of the triangular wave and other characteristics of the load, such as the frequency response of a loudspeaker, to provide the desired results in a particular application.

The circuit as it has been described is satisfactory for use as an amplifier for feeding a resistive load. When used with a reactive load, such as an electrodynamic loudspeaker (inductive) or a ceramic loudspeaker (capacitive), there is a phase shift between the applied voltage and the current which is produced in the load. For proper operation, it is necessary to provide a path for reverse current flow. Such a path is provided by the diodes 31, 33, 35 and 37 in the bridge circuit, and diode 46 and transistor 76 of the energizing circuit 41. Negative current can flow through diode 33, load 65, coil 64, diode 37 and diode 46 to the supply terminal. A similar path is provided through diode 35, coil 64, load 65 and diodes 31 and 46. These paths for reverse current flow return reactive energy to the supply, which is particularly important when a battery is used as the supply.

Transistor 76 provides a path to ground from bridge terminal 25 when the energizing transistor 42 is turned off. Transistor 76 is controlled by the voltage comparator 14, and is turned on when the output of the comparator 14 is zero between the pulses produced thereby.

The output of comparator 14 is connected by resistor 77 to the base electrode of transistor 78, and when the output of comparator 14 is zero, transistor 78 is off. The supply voltage from terminal 40 is applied through resistor 79 to the collector electrode of transistor 78, which is connected by diode 80 to the base electrode of transistor 76. When transistor 78 is off, the supply voltage is applied through resistor 79 and diode 80 to the base of transistor 76 to turn this transistor on. Transistor 76 provides a path for reverse current flow through diode 33, load 65, coil 64 and diode 37 during positive portions of the input signal, and through diode 35, coil 64, load 65 and diode 31 during negative portions.

In the above, it was stated that a positive potential is provided on conductor 54 which is applied through resistor 55 to transistor 52, and through resistor 73 to transistor 72. For more efficient operation of the switching amplifier, the potential on conductor 54 can be provided by an amplifier and clipper 18, which is connected to the full wave rectifier 12 in FIG. 1. FIG. 2 in line F shows the output of amplifier and clipper 18 and it will be apparent that clipping takes place during about 30 percent of the time. It has been found that clipping during 20 to 30 percent of the time provides the best results. This voltage (line F) applied to the driver transistors 62 and 74 by action of transistors 52 and 72 provides a lower supply voltage when the signal level is low, thus reducing the dissipation in these transistors, as well as in transistors 30, 32, 34 and 36 of the bridge circuit. This action produces a substantial increase in efficiency when the amplifier is used with speech signals, as the average level of such signals is much lower than the peak values which must be produced for high fidelity reproduction. Accordingly, the power efficiency of the amplifier can approach 100 percent.

The switching amplifier system of the invention forms a highly efficient power amplifier for use in amplifying speech or other audio signals. The system can also be used in other applications, such as for a power supply. The system is particularly advantageous when used in battery operated equipment, such as a portable radio or pager, as it operates from a single polarity supply to provide a bipolar output having a peak-to-peak value equal to twice the supply voltage. The switching devices of the bridge circuit operate at the relatively slow rate of the applied signal (speech) and devices suitable for use at such frequencies can be formed by an integrated circuit, so that the amplifier can be a compact inexpensive unit highly suitable for portable use. Only the energizing and ground switches need operate at a higher rate, and these can be provided as discrete semiconductor devices. The system is adapted for use with reactive loads and operates to return reactive current to the battery or other supply. Also, the system acts to reduce dissipation in the driver and switching devices in response to low level signals to further increase the power efficiency of the amplifier system.

We claim:

1. A switching amplifier for amplifying a bipolar wave to provide a high power output, including in combination,
    pulse width modulation means for receiving the bipolar wave and for producing a single train of unipolar pulses having a constant repetition rate which is substantially greater than the highest frequency of the bipolar wave, said pulses of said train each having a duty cycle proportional to the instantaneous amplitude of the bipolar wave,
    a bridge circuit having four terminals and four semiconductor switching means connecting said terminals, each of said switching means having a control terminal for rendering the same conductive,
    energizing means coupled to said modulation means and to said bridge circuit for connecting supply means of a single polarity across diagonal terminals of said bridge circuit for the duration of each pulse produced by said modulation means,
    control means having a first portion connected to said control terminals of a first opposite pair of said switching means for rendering the same conductive and a second portion connected to said control terminals of the other two of said switching means for rendering the same conductive, said control means including sensing means responsive to the bipolar wave for rendering said first portion operative during portions of the wave of one polarity and for rendering said second portion operative during opposite polarity portions of the wave, and
    filter means connected to said terminals of said bridge circuit not connected to said energizing means for connecting a load thereto, said switching means applying current pulses to said filter means in opposite directions in response to portions of the bipolar wave which are of opposite polarities with the duration of the current pulses applied to said filter means varying with the amplitude of the bipolar wave, said filter means reducing fluctuations in the voltage applied to the load resulting from the switching action.

2. A switching amplifier in accordance with claim 1 wherein each semiconductor switching means of said bridge circuit includes a transistor having emitter and collector electrodes providing a switchable conductive path and a base electrode coupled to said control terminal, and a diode connected in parallel across said emitter and collector electrodes with a polarity to conduct current in the direction opposite to the conduction of said transistor.

3. A switching amplifier in accordance with claim 2 wherein said energizing means includes a transistor having emitter and collector electrodes forming a path for applying current to said bridge circuit, and a base electrode connected to said modulation means for controlling the conduction through said path, and rectifier means connected across said emitter and collector electrodes with a polarity to conduct current in the direction opposite to the conduction of said transistor, whereby reverse current developed in the load can flow through said diodes of said switching means and said rectifier means of said energizing means to said supply means.

4. A switching amplifier in accordance with claim 3 wherein said energizing means includes a further transistor connected to said bridge circuit for selectively connecting the same to a reference potential, and means connecting said further transistor to said modulation means for rendering said further transistor conductive in response to termination of a pulse produced by said modulation means, whereby a path is provided for current flow from the load to the reference potential at the termination of the application of current from said energizing means to said bridge circuit.

5. A switching amplifier in accordance with claim 1 wherein said control means includes means responsive to the applied bipolar wave to control the potential applied to said portions of said control means in accordance with the amplitude of the wave.

6. A switching amplifier in accordance with claim 1 wherein said modulation means includes a full wave rectifier for rectifying the bipolar wave, clipper means coupled to said full wave rectifier for providing a bias voltage which varies with the amplitude of the applied sinusoidal wave, and means coupling said clipper means to said control means for applying said bias voltage to said control means for reducing the drive of said first and second portions thereof for portions of the bipolar wave having small value.

7. A switching ampliifier in accordance with claim 6 wherein said portions of said control means control said semiconductor switching means to reduce the dissipation in said control means and said switching means during portions of the bipolar wave having small value.

* * * * *